United States Patent [19]

Leveque

[11] 4,107,612
[45] Aug. 15, 1978

[54] PHASE LOCKED LOOP EXCITER GENERATOR FOR HIGH FREQUENCY TRANSMITTER

[75] Inventor: J. Howard Leveque, Harper's Ferry, W. Va.

[73] Assignee: Frederick Electronics Corporation, Frederick, Md.

[21] Appl. No.: 683,383

[22] Filed: May 5, 1976

[51] Int. Cl.² ........................ H04B 1/04; H03B 3/06
[52] U.S. Cl. .................................. 325/171; 325/184; 331/18; 331/25
[58] Field of Search ..................... 325/17, 20, 25, 171, 325/174, 175, 177, 184, 153, 419, 146, 148; 331/1 A, 18, 25

[56] References Cited

U.S. PATENT DOCUMENTS

| 2,568,412 | 9/1951 | Robinson | 325/146 |
| 3,641,434 | 2/1972 | Yates et al. | 325/25 |
| 3,696,422 | 10/1972 | Burrell | 325/17 |
| 3,710,274 | 1/1973 | Basse et al. | 331/18 |
| 3,713,040 | 1/1973 | Page, Jr. | 331/18 |
| 3,983,484 | 9/1976 | Hodama | 325/20 |
| 4,009,451 | 2/1971 | Moore et al. | 325/25 |
| 4,035,727 | 7/1977 | Ishii | 325/17 |

Primary Examiner—Robert L. Griffin
Assistant Examiner—Marc E. Bookbinder
Attorney, Agent, or Firm—Arnold, White & Durkee

[57] ABSTRACT

A phase locked loop signal generator is especially adapted for synthesizing a selectable frequency signal for exciting an HF radio frequency transmitter to transmit over the seven marine telegraph bands. The signal generator includes an oscillator for providing a highly stable frequency standard. Another signal generator is responsive to the frequency standard and to frequency selector signals input by the operator for generating an exciter signal which is coupled to the transmitter for effecting the RF transmission within a predetermined frequency range. The exciter signal generator includes: a reference dividing circuit programmable in response to the frequency selector signals for providing a reference frequency signal having a frequency which is a fractional part of that of the frequency standard; a phase locked loop circuit having a frequency divider in the feedback loop which is responsive to the reference frequency signal for producing an intermediate signal having a frequency which is a multiple of that of the reference frequency signal; and an output divider circuit is coupled to the phase locked loop circuit and is responsive to the frequency selector signal for generating the exciter signal to be at a frequency which is a fractional value of that of the intermediate signal. By varying the frequency selector signal, over 5000 transmitting frequencies are available using a conventional harmonic-related transmitter.

12 Claims, 9 Drawing Figures

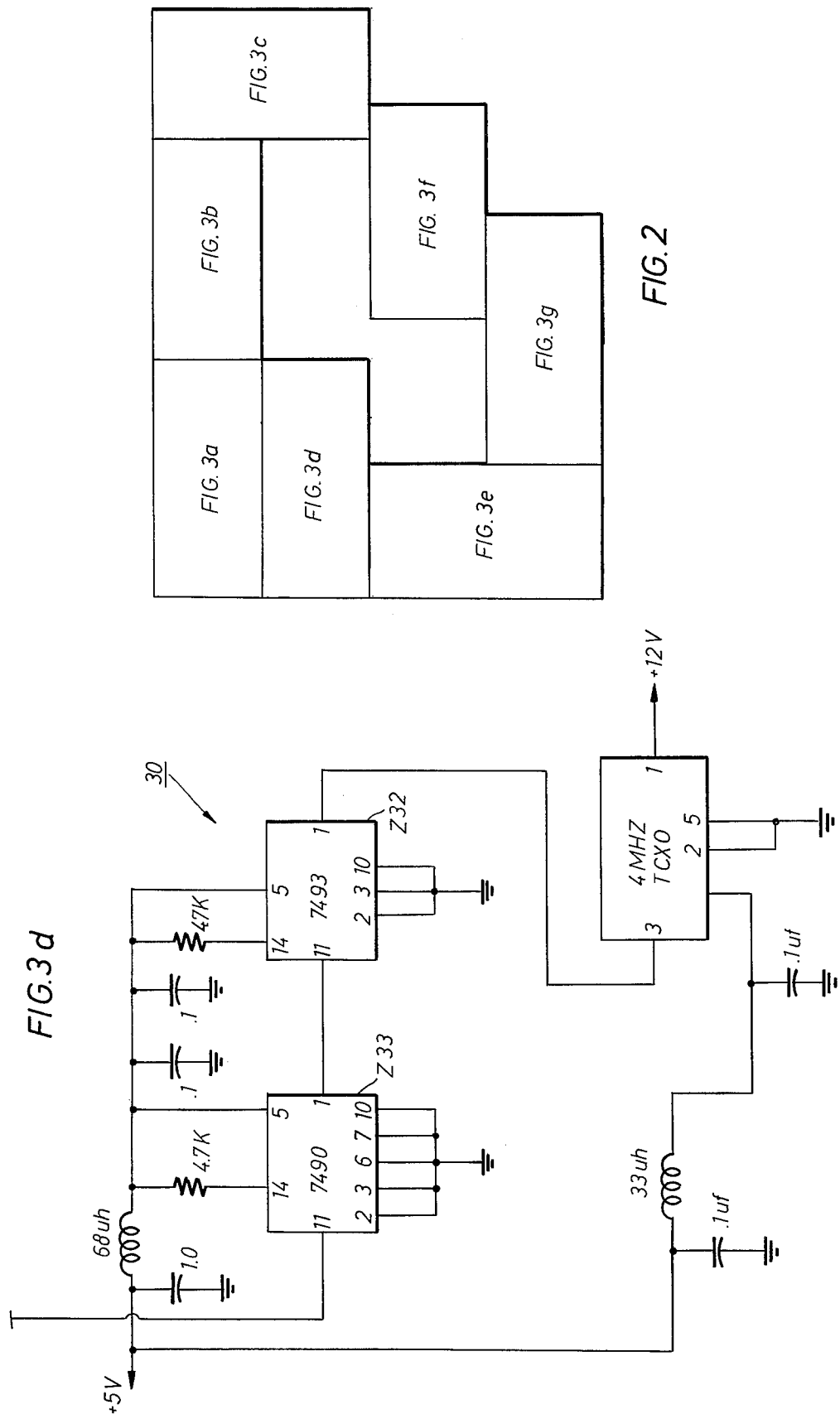

PHASE LOCKED LOOP EXCITER GENERATOR FOR HIGH FREQUENCY TRANSMITTER

BACKGROUND OF THE INVENTION

This invention relates generally to phase locked loop signal generators and more particularly to phase locked loop signal generators for exciting harmonic related transmitters operating over the marine telegraph bands.

Harmonically related transmitters are conventionally utilized for transmission in the 7 discrete frequency bands between approximately 4 and 25 megaHertz covering the seven marine telegraph bands. These transmitters require seven corresponding discrete frequency bands as inputs, the specific input bands being a factor of the specific design of the transmitter.

Historically, the approach taken for exciting these transmitters has been to utilize an internal crystal oscillator or a general purpose signal generator rather than a dedicated signal generator designed for the specific task. In terms of synthesized generators, general purpose signal generators are relatively more expensive and are larger requiring more space than a generator dedicated to the particular task and having design characteristics optimized for the overall system. Many of the general purpose signal generators, although of the phase locked loop type, require several feedback loops. This not only complicates the electronics involved, but also adds to the expense.

Furthermore, many of the general purpose type signal generators by the very nature require several manual inputs from the operator of the system, thereby unnecessarily complicating operating procedures.

SUMMARY OF INVENTION

It is therefore a general object of the present invention to provide a new and improved signal generator of the phase locked loop type suitable for synthesizing a selectable frequency exciter signal for exciting a harmonically related transmitter, while overcoming the above noted shortcomings of the prior art.

The present invention fulfills this object by providing a phase locked loop signal generator which is relatively inexpensive, is of small size, and is highly versatile, being able to select more than 5000 transmission frequencies in 100 Hertz steps across the marine bands. The signal generator provides a phase locked loop having a wide dynamic capture range, and use of a variable modulous prescaler in the loop provides improved loop resolution. The unit is designed for versatility in positioning by allowing the generator to be positioned in close in association with the transmitter without impairing the signal wave form due to long cable lengths and the like. The signal generator advantageously may be externally keyed on and off and includes a fault detector which disables the signal generator (1) during carrier frequency changes and (2) if the unit should malfunction, such as the loop becoming out of phase lock.

According to the invention, the signal generator includes an oscillator for providing a highly stable frequency standard signal. A signal generator is responsive to the frequency standard signal and to frequency selector signals input by the operator of the unit for generating an exciter signal which is coupled to the transmitter for effecting the RF transmission within a predetermined frequency range.

The exciter signal generator includes a reference dividing circuit programmable in response to the frequency selector signals for providing a reference frequency signal having a frequency which is a fractional part of that of the frequency standard signal; a phase locked loop circuit is provided responsive to the reference frequency signal for producing an intermediate signal having a frequency which is a multiple of that of the reference frequency signal; and an output divider circuit coupled to the phase locked loop circuit is responsive to the frequency selector signal for generating the exciter signal to be at a frequency which is a fractional value of that of the intermediate signal. By varying the frequency selector signal, over 5000 transmitting frequencies are available using a conventional harmonic related transmitter.

The phase locked loop circuit preferably includes a voltage controlled oscillator circuit for producing the intermediate signal in response to an error signal. A loop frequency divider circuit is coupled to the voltage control oscillator circuit for producing a divided down intermediate signal of a frequency determined at least partially by the frequency selector signal. To this end the loop frequency divider circuit includes a plurality of programmable counters which are responsive to the frequency selector signal, their particular programmed state determining the factor by which the frequency of the intermediate signal is reduced.

The phase locked loop circuit also includes a phase detector and filter circuit which is responsive to the reference frequency signal and to the divided down intermediate signal. The phase detector and filter circuit produces the error signal representative of any frequency difference between the divided down intermediate signal and the reference frequency signal. Once the loop is in phase lock, the phase and/or frequency difference between the reference and divided down intermediate signals is held constant by minute adjustments of the voltage control oscillator circuit. The adjustments are effected by comparison by the phase detector and filter circuit.

According to the preferred embodiment, the phase detector and filter circuit comprises a phase detector circuit which is responsive to the reference signal generator and to the divided down intermediate signal for producing pulses which are indicative of the frequency difference therebetween. It also includes a band pass filter circuit which is responsive to the pulses for producing the error signal to have a DC level representative of the frequency difference between the reference frequency signal and the divided down intermediate signal.

In the preferred embodiment the output divider circuit includes: an output amplifier circuit which generates the exciter signal to the transmitter; a filtered output dividing circuit: and an RF switch. The filtered output dividing circuit is responsive to the intermediate signal and to the frequency selector signal for producing a filtered intermediate signal of a frequency reduced from that of the intermediate signal. The RF switch is coupled between the filtered output dividing circuit and the output amplifier circuit for selectively coupling the filtered intermediate signal to the output amplifier circuit in response to a keying signal.

As a feature of the invention, the RF switch includes a driver circuit having a low output impedance so that the length of the connecting cable between the output amplifier circuit and the driver circuit virtually has no effect on the signal provided to the output amplifier circuit. This allows the output amplifier circuit to be physically positioned as close as possible to the input to the transmitter, allowing the remainder of the signal generator to be positioned at any convenient location without affecting performance.

In the preferred embodiment the RF switch includes a set of diodes which are biased into either a conductive or nonconductive state by the keying signal. A detector circuit is provided for generating the keying signal to render the diodes nonconductive to disable the signal generator upon a condition that (a) the value of the frequency selector signal is altered, implying change of the carrier frequency and (2) the divided down intermediate signal differs from the reference frequency signal by at least a predetermined value, implying the phase locked loop circuit has become out of phase lock.

As yet another feature of the invention, the loop divider circuit is especially implemented using a "variable modulous prescaler" technique. This maintains the loop resolution which otherwise would be lost if a fixed modulous prescaler were used. More specifically, the loop frequency divider circuit includes a plurality of programmable counters having their program count changed at predetermined time intervals. The counters are reprogrammed during the countdown of the intermediate signal to effectively extend the frequency range.

Other objects, features, and advantages will be apparent upon consideration of the following description of a preferred embodiment when taken in conjunction with accompanying drawings, wherein:

FIG. 2 is a drawing layout of FIGS. 3a–3g; and

FIG. 3a-3g are circuit schematics functionally represented in the diagram of the FIG. 1.

DETAILED DESCRIPTION OF A PREFERRED EMBODIMENT

Figure 1:
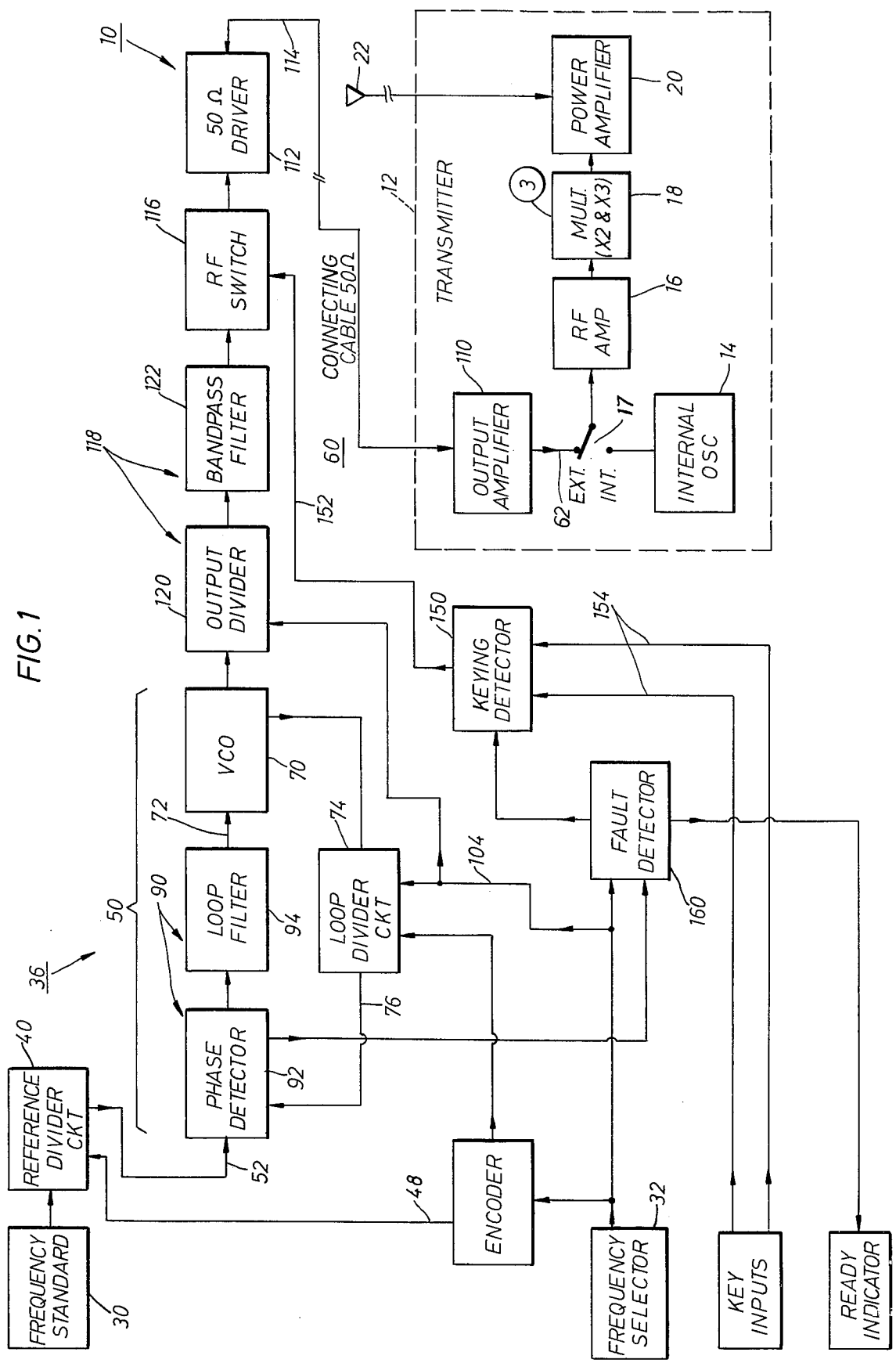
FIG. 1 is a functional block diagram of the signal generator and the harmonic related transmitter according to the invention.

Referring now to FIG. 1, a phase locked loop signal generator 10 is depicted for exciting a radio wave transmitter 12 to transmit over selectable frequency ranges in response to an exciter signal of a variable and selectable frequency produced by the generator 10. The transmitter 12 is a conventional harmonic-related transmitter used as an HF radio frequency maritime transmitter transmitting over the seven telegraph bands. The transmitter 12 includes: an internal oscillator 14; an RF amplifier 16 connected to the internal oscillator 14 by a switch 17: a multiplying circuit 18 for increasing the frequency of the signal produced by the RF amplifier 16 by a factor of either two, three, four, six, or eight; and an output power amplifier 20. The amplifier 20 drives an antenna 22 transmitting at the desired frequency. A transmitter 12 of the described type is commercially available from ITT Corporation as Model No. 2013, HARMONIC-RELATED TRANSMITTER. It transmits over six of the seven maritime bands as shown in Table 1 according to exciter signal inputs from the signal generator 10 as follows:

| BAND | EXCITER FREQ OUT (MHz) | INTERNAL XMTR MULT | XMTR FREQ OUT (MHz) |
|---|---|---|---|
| 4 MHz | 2.090100 to 2.109500 | X2 | 4.180200 to 4.219000 |
| 6 MHz | 2.090100 to 2.182333 | X3 | 6.270300 to 6.324700 |
| 8 MHz | 2.080625 to 2.108750 | X4 | 8.358500 to 8.435000 |
| 12 MHz | 2.088000 to 2.108500 | X6 | 12.528000 to 12.651000 |
| 16 MHz | 2.088375 to 2.107250 | X8 | 16.707000 to 16.858000 |
| 22 MHz | 2.778500 to 2.788625 | X8 | 22.228000 to 22.309000 |
| 25 MHz | 3.133875 to 3.138563 | X8 | 25.071000 to 25.108500 |

As is shown in Table I, for the first five frequency bands, the transmitter 12 multiplies essentially exciter signal inputs of the same frequency by different integers to effect the proper transmission frequency. For the last two bands, the transmitter 12 uses a constant multiplier and requires exciter signal inputs of significantly different frequencies.

The signal generator 10 generates from a basic frequency standard the exciter signal having the proper frequency according to Table I. In the illustrated embodiment of FIG. 1, the frequency standard is 100 kilohertz and is produced by a 100 kilohertz oscillator functionally depicted at 30.

A signal input mechanism 32 is provided for generating a frequency selector signal indicative of the desired frequency at which the transmitter 12 is to operate. The input mechanism 32 may be any mechanism, but in the preferred embodiment it includes manually operated thumbwheel switches which, except for an external keying control, controls all operations of the signal generator 10. The input mechanism 32 has a seven-line output, one for each band. The output format of the mechanism 32 is decimal, with a particular line providing a signal with a logic high state when its associated transmitting band position is selected. The output lines of the input mechanism 32 are connected to seven switches. The values of the first switch corresponds to the units or tens digits of the megaHertz of the transmitter and is displayed. The values of the second, third, fourth and fifth switches are also displayed and respectively represent the hundreds of kilohertz, the tens of kilohertz, the units of kilohertz and the hundreds of hertz frequencies output by the transmitter 12. The outputs of these switches are on four lines and are encoded in binary coded decimal.

The oscillator 30 and input mechanism 32 are coupled to an enable signal generator 36 which is responsive to the frequency standard signal and to the frequency selector signal for generating the exciter signal of a preselected frequency to the transmitter 12.

The enable signal generator 36 includes a reference dividing circuit 40 coupled to the oscillator 30 for providing a reference frequency signal having a frequency which is a fractional part of that of the frequency standard signal produced by the oscillator 30. The reference frequency determines the frequency steps of the signal transmitted by the transmitter 12. To accommodate the changing multiplying factor internal to the transmitter 12, the frequency of the reference frequency signal is changed from band to band. Referring additionally to FIGS. 3a–3f, the reference dividing circuit 40 is comprised of a fixed divider counter 42 and two programmable counters 44 and 46 which are programmed responsive to the frequency selector signal from the input mechanism 32.

The enable signal generator 36 also includes a phase locked loop circuit 50 responsive to the reference frequency signal on a line 52 for producing on a line 54 an intermediate signal having a frequency which is a multiple of the reference frequency signal.

The enable signal generator 36 further includes an output divider circuit 60 coupled to the phase locked loop circuit 50 for receiving the intermediate signal for generating the exciter signal on a line 62 to the transmitter 12. The output divider circuit 60 generates the exciter signal to have a frequency which is a fractional value of that of the intermediate signal on the line 54, the value being determined at least in part by the value of the frequency selector signal input through the input mechanism 32.

Figure 3A:
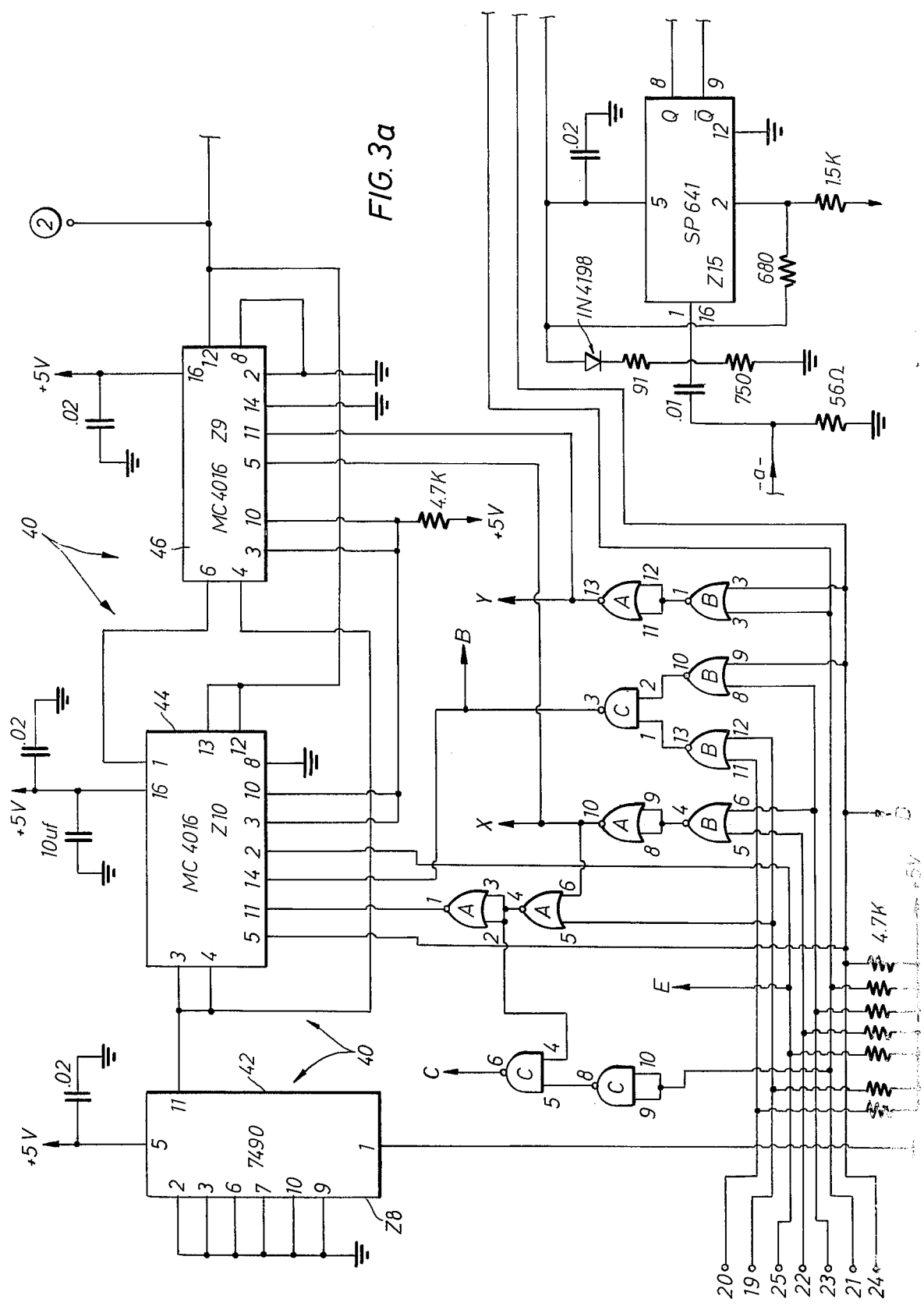
Figure 3B:
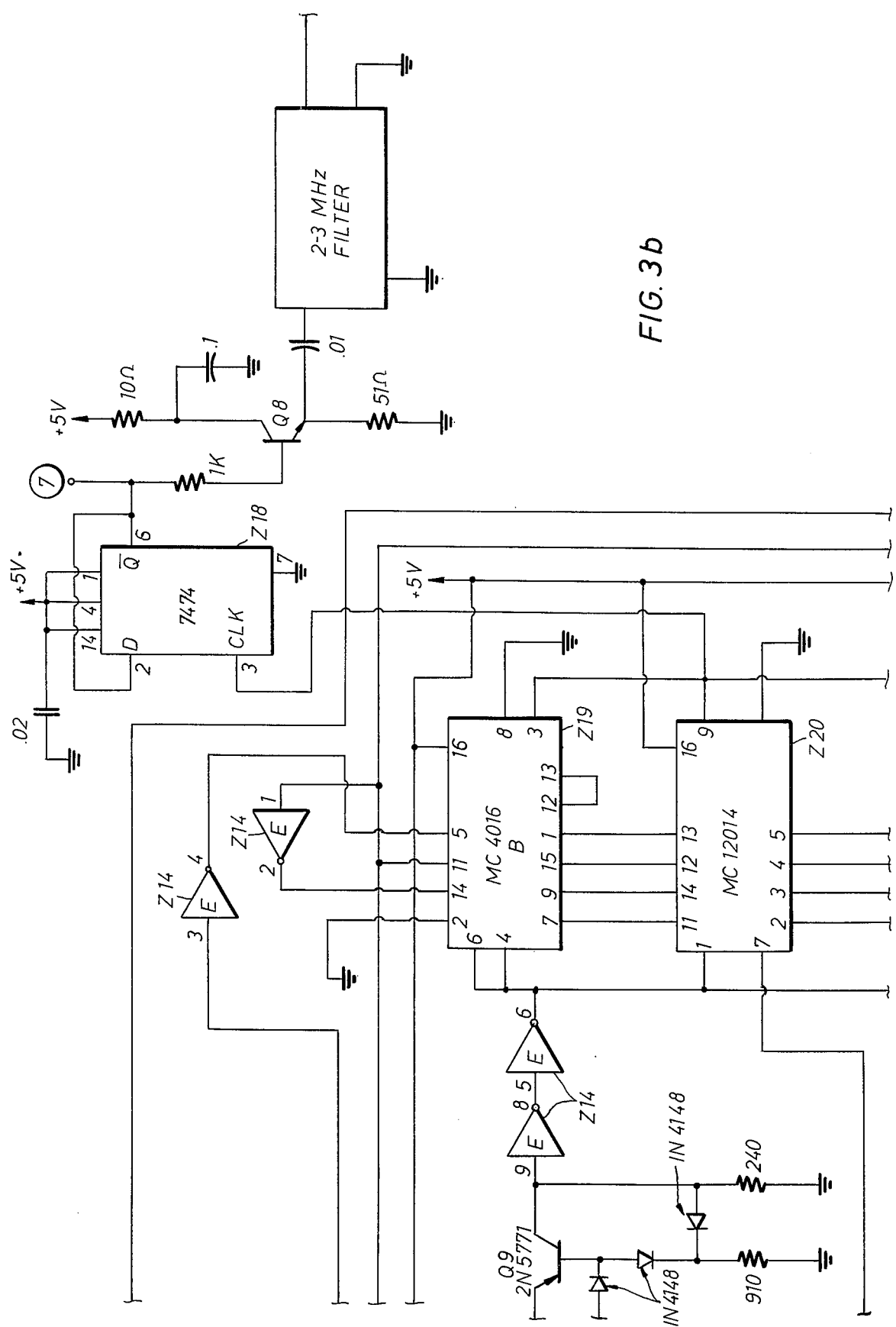
Figure 3C:
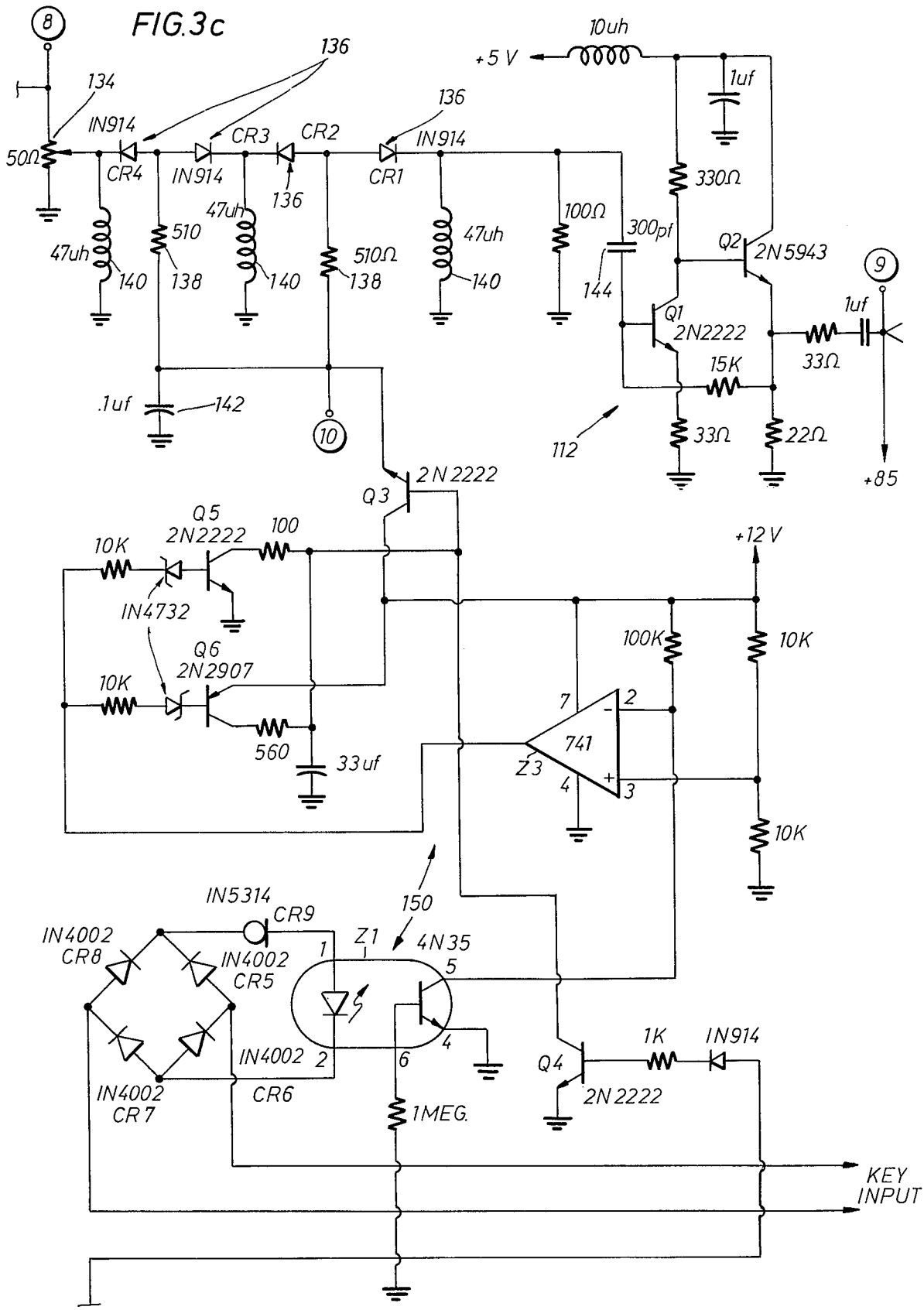
Figure 3E:
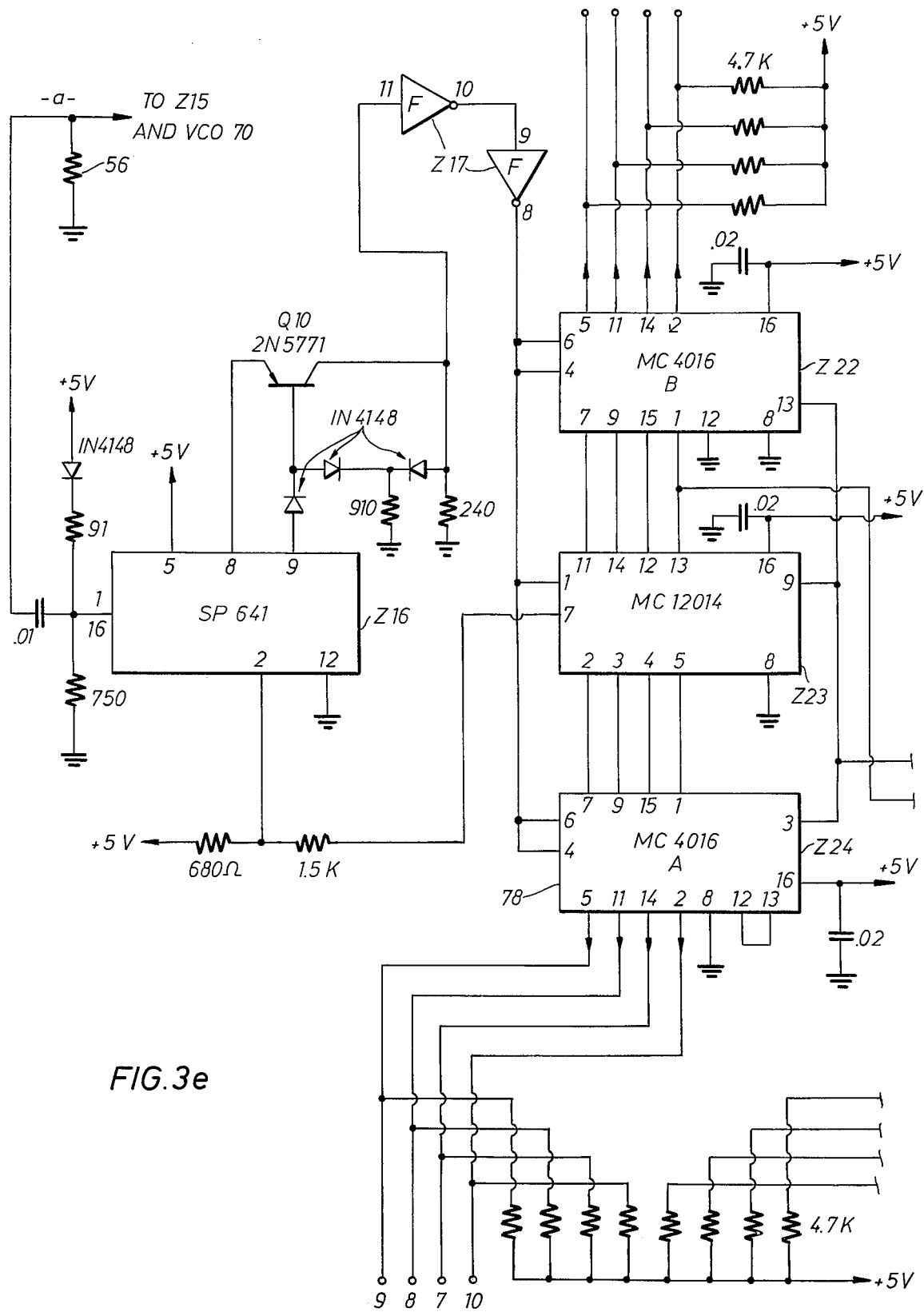
Figure 3F:
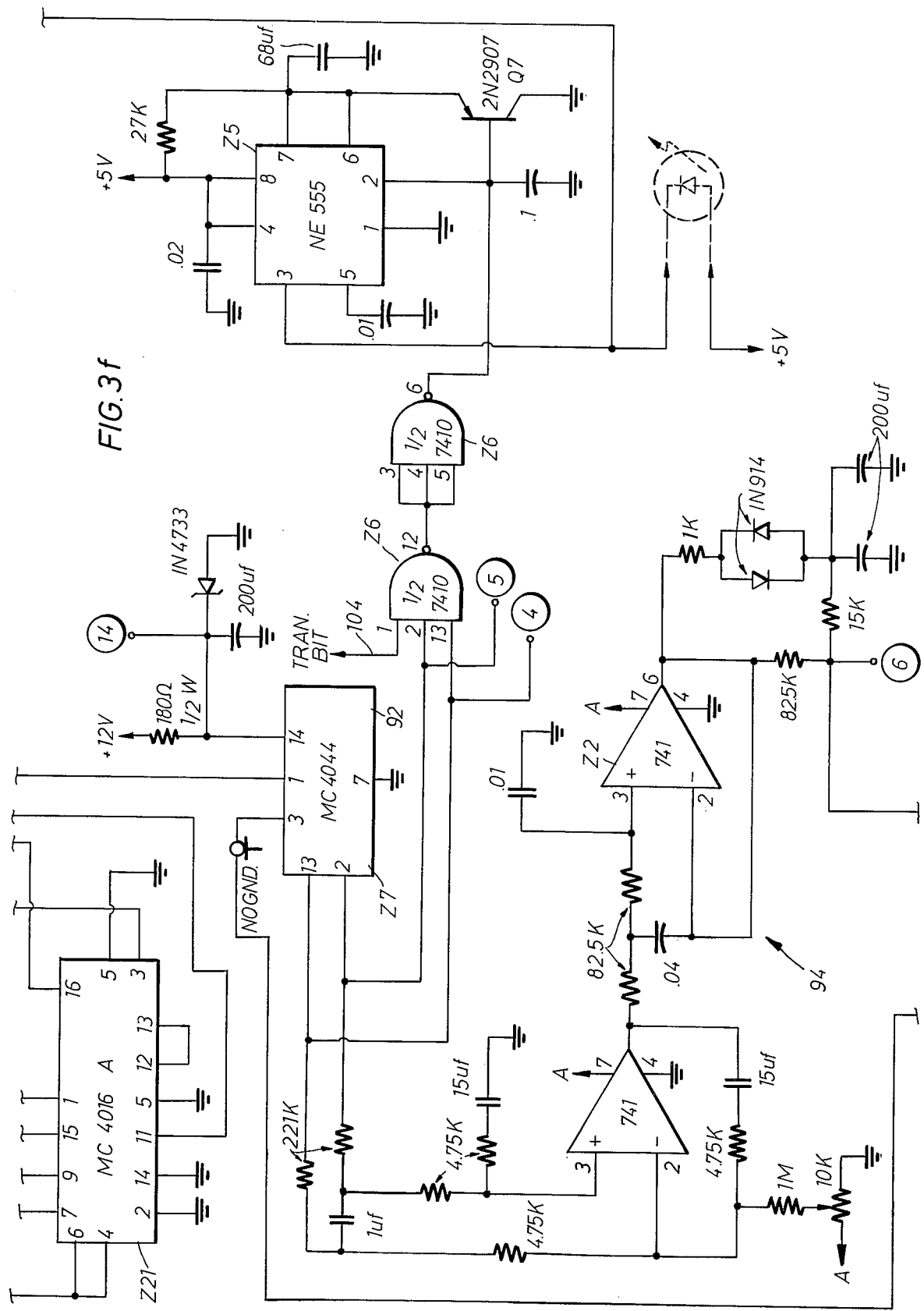
Figure 3G:
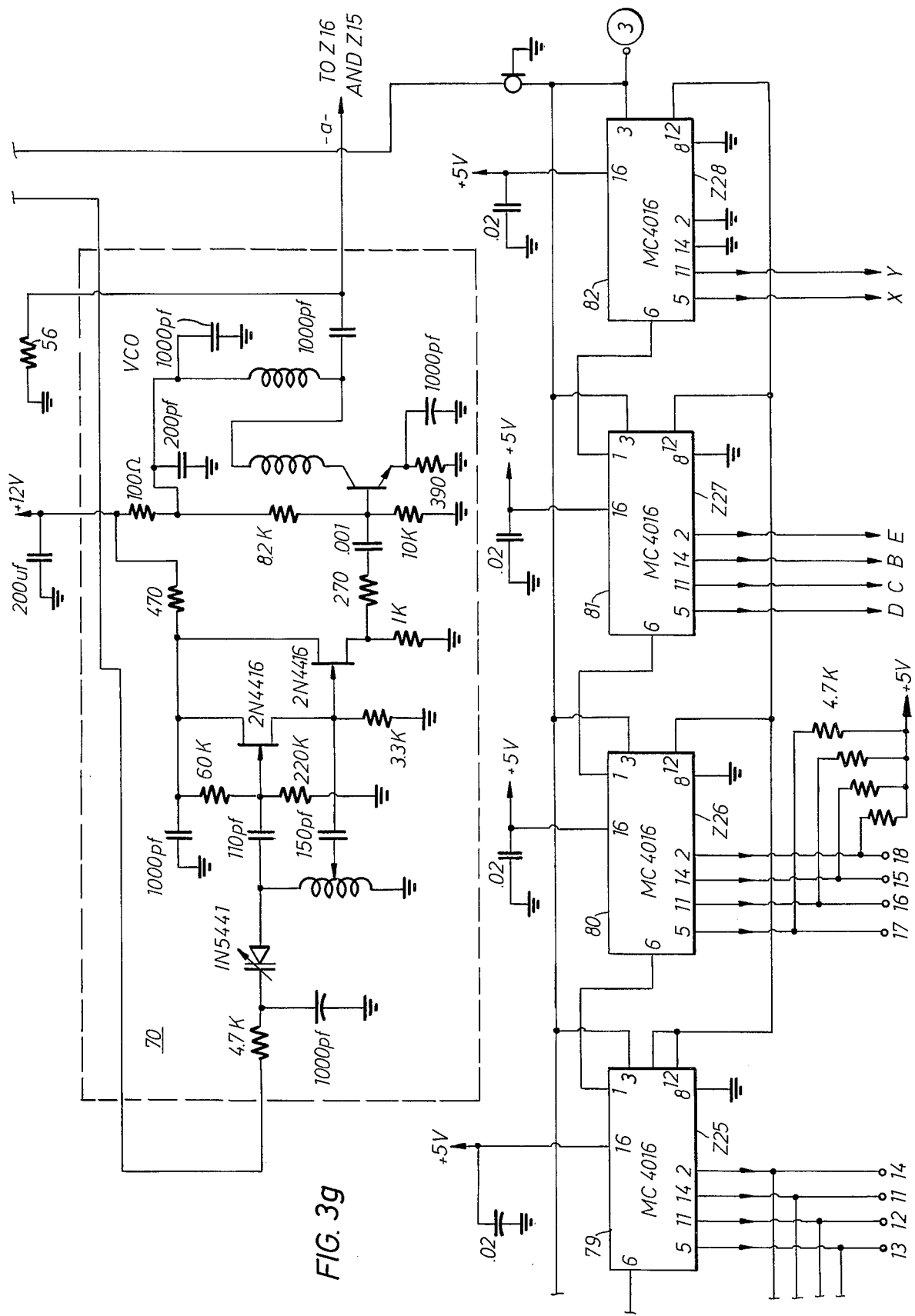

Referring now to FIGS. 1, 3e and 3g the phase locked loop circuit 50 is shown in more detail. It includes a voltage controlled oscillator circuit 70 for producing the intermediate signal in response to an error signal on a line 72. The voltage control oscillator is conventional and generates the intermediate signal to have a frequency between approximately 200 and approximately 223 megaHertz (see Table II, Column 4).

voltage controlled oscillator 70. As will become apparent the smallest frequency change step obtainable at the output of the voltage controlled oscillator 70 is equal to the frequency of the reference frequency signal on the line 52.

The phase locked loop circuit 50 also includes a phase detector and filter circuit 90 which is responsive to the reference frequency signal on the line 52 and to the divided down intermediate signal on the line 76 for producing the error signal on the line 72. The phase detector and filter circuit 90 generates the error signal representative of the frequency difference between the divided down intermediate signal and the reference frequency signal.

The phase detector and filter circuit 90 includes a phase detector circuit 92 and a loop filter amplifier circuit 94. The phase detector circuit 92 determines the phase/frequency difference between the reference frequency signal underlying 52 and of the divided down intermediate signal underlying 76. A preferred phase detector circuit (see FIG. 3f) is the MC4044 integrated circuit commercially available from Motorola Semiconductor Products, Pheonix, Arizona. This detector is a dual detector and preferably the detector which responds only to negative transitions is selected. Because

|  | EXCITER |  |  |  |  |  | TRANSMITTER |  |  |  |
|---|---|---|---|---|---|---|---|---|---|---|
|  | 1 | 2 | 3 | 4 | 5 | 6 | 7 | 8 | 9 | 10 |
| Output Frequency Band | Ref. Dividers Divisor | Ref. Frequency (XHZ) | Loop Dividers Divisor | VCO Frequency (MHZ) | Output Dividers Divisor | Exciter Output Frequency (MHZ) | Exciter Output Frequency Steps (HZ) | XMTR Mult. | Transmitter Output Frequency (MHZ) | Transmitter Output Frequency Steps (HZ) |
| 4 MHZ | 20 | 5.000 | 41802 – 42190 | 209.0100 – 210.9500 | 100 | 2.0001 – 2.1095 | 50 | X2 | 4.180200 – 4.219000 | 100 |
| 6 MHZ | 30 | 3.333 | 62703 – 63247 | 209.0100 – 210.8233 | 100 | 2.0901 – 2.108233 | 33.333 | X3 | 6.270300 – 6.324700 | 100 |
| 8 MHZ | 40 | 2.500 | 83585 – 84350 | 208.9625 – 210.8750 | 100 | 2.089625 – 2.10875 | 25 | X4 | 8.358500 – 8.435000 | 100 |
| 12 MHZ | 60 | 1.666 | 125280 – 126510 | 208.8000 – 210.8500 | 100 | 2.0880 – 2.1085 | 16.666 | X6 | 12.528000 – 12.651000 | 100 |
| 16 MHZ | 80 | 1.250 | 167070 – 168580 | 208.8375 – 210.7250 | 100 | 2.088375 – 2.10725 | 12.5 | X8 | 16.707000 – 16.858000 | 100 |
| 22 MHZ | 100 | 1.000 | 222280 – 223090 | 222.2800 – 223.0900 | 80 | 2.7785 – 2.788625 | 12.5 | X8 | 22.22800 – 22.309000 | 100 |
| 25 MHZ | 125 | 0.800 | 250710 – 251085 | 200.5680 – 200.8680 | 64 | 3.133875 – 3.138563 | 12.5 | X8 | 25.071000 – 25.108500 | 100 |

Table II summarizes operation of the signal generator 10 and the transmitter 12.

The particular frequency of the voltage control oscillator 70 depends upon the particular input from the input mechanism 32, and the error signal is adjusted until the output of the voltage control oscillator is that frequency which is equal to the referenced frequency on the line 52 multiplied by a loop factor, as will subsequently be explained. The phase locked loop circuit 50 also includes a loop divider circuit 74 coupled to the voltage control oscillator circuit 70. The loop divider circuit 74 provides a divided down intermediate signal on a line 76 of a frequency determined at least partially by the frequency selector signal input via the mechanism 32. The loop divider circuit 74 includes a set of serially connected programmable counters 78, 79, 80, 81 and 82 which are programmed responsive to the frequency selector signal. They are programmed to divide the intermediate signal by a loop factor of value which causes the frequency of the divided down intermediate signal to equal that of the reference frequency signal (or conversely by the loop factor which when multiplied by the frequency of the reference frequency signal equals the frequency of the intermediate signal on the line 54.) Accordingly, changing the loop factor of the loop divider circuit changes the output frequency of the of transition response rather than level response, phase error detection utilizing this detector is independent of input wave form duty cycle or amplitude variation. When phase or frequency difference occurs at the detector input, the detector 92 generates pulses at one of two output terminals, depending upon the direction of the difference.

The loop filter amplifier circuit 94 is a conventional filter/amplifier circuit and is shown in more detail in FIG. 3f. The loop filter amplifier circuit 94 is connected to the output pins of the phase detector circuit 92 and generates a DC voltage proportional to the phase/frequency error. This DC voltage is the error signal on the line 72.

As a feature of the phase locked loop circuit 50 comprising the phase detector circuit 92, the loop filter amplifier circuit 94, the voltage controlled oscillator circuit 70 and the loop divider circuit 74, a "variable modulous prescaler" technique is used in the loop divider circuit 74 for minimizing the need of high speed logic circuitry. In other words, the variable modulous prescaler technique retains the loop resolution which would be lost if a fixed modulous prescaler were used.

In more detail, the output from the voltage control oscillator 70 is applied to the input of the loop divider circuit 74 at pins 1 and 16 of a high speed logic prescaler circuit Z16. (see FIG. 3e). The high speed logic prescaler circuit Z16 is an emitter coupled logic circuit. The output of the prescaler Z16 is applied through an emitter coupled logic circuit (ECL) to a transistor transistor logic (TTL) matching network to a KH counter Z22. The output of the prescaler Z16 is also coupled to a counter control circuit Z23 and to a 100 HZ counter Z24. A pair of inverters Z17 at the output of the prescaler Z24 are utilized for fan out purposes.

The counter control circuit Z23 includes a zero detection circuit and an early-decode circuit. The counter control Z23 achieves the dual function of changing the prescaler modulous at the correct (programmed) time and of early decoding and reprogramming of the variable dividers. This has the advantageous of effect of extending the frequency range of the variable dividers.

In operation, the entire programmable counter comprising the 100 HZ counter Z24, the 1 KHZ Z22, and the counters Z25-Z28 is set to a particular divisor by inputs from the input mechanism 32 via the frequency selector signal on line 104. The count cycle begins with a prescaler Z16 dividing by the value 11. Both the 100 HZ counter Z24 and the 1 KHZ counter Z22 are directly toggled by the prescaler output upon each occurrence. When the 100 HZ counter Z24 reaches zero, the zero detection circuit provides a logic high signal to the prescaler Z16. This high input signal changes the divisor of the prescaler from 11 to 10. The remainder of the count, as determined by the cascaded counters Z22, Z25-Z28 is completed at the prescaler modulous of 10. At the completion of the count, the bussed output line (pin 3 of the counters, pin 9 of the counter control) is pulsed which reenters the program into the counters and resets the counter control zero detection circuit 100 to command the prescaler Z18 to divide by 11. The cycle repeats for each output pulse produced.

The frequency range extension feature extends a frequency range of the counting chain to approximately 25 MHZ. Although this technique results in the loss of the ability of the counters to divide by 1 and 2, this is inconsequential for this application. The extended frequency range is achieved by the early decode circuit producing an output pulse two counts early and holding it until the count is completed. This allows the counter to be reprogrammed during the last two counts, rather than within the first count after the cycle is completed.

The output divider circuits 60 include an output amplifier circuit 110 for providing the exciter signal to the transmitter 12. The output amplifier circuit 110 is effectively an impedance and low level matching device for coupling to the high input impedance of the transmitter 12. As a feature of the invention, the output amplifier circuit 110 is physically disassociated from the remainder of the signal generator 10 and is physically mounted in the crystal compartment of the transmitter 12 to minimize the length of the lead.

The output divider circuit 60 also includes a 50 OHM driver/amplifier circuit 112 having its output coupled to the amplifier circuit 110 by a length of connecting 50 OHM cable 114. The input of the driver amplifier circuit 112 is connected to the output of an RF switch 116 having an input coupled to the output of a filtered output divider circuit 118. The filter output dividing circuit 118 is responsive to the intermediate signal on the line 54 and to the frequency selector signal on the line 104 for producing a filtered intermediate signal of frequency reduced from that of the intermediate signal. Depending upon the state of the RF switch 116, the filtered intermediate signal is selectively coupled to the output amplifier circuit 110 through the driver/amplifier circuit 112 and cable 114.

The filtered output divider circuit 118 includes an output divider circuit 120 and a band pass filter 122. The output driver circuit 120, although of simpler design than the loop divider circuit 74, uses the same variable modulous prescaler and frequency extendiing technique. The output divider circuit 120 is programmed by input from the input mechanism 32 (the units and tens MHZ digits corresponding to the transmitted band) through a frequency band logic circuit. The operation of the output divider circuit 120 is similar to that of the loop divider circuit 74. Referring to FIGS. 3a and 3b Z15 is the high speed logic variable modulous prescaler, Z20 is the counter control and Z21 is the counter which is zero detected to change the prescaler modulous.

The frequency from the programmable sections of the output divider circuit 118 is applied to a final divide by two flip flop Z18 (see FIG. 3b). The divisor implemented by the output divider circuit 118 are listed in Table II, Column 5. The signal from the output divider 120 is a square wave of between 2.08 MHZ and 3.14 MHZ (see Table II, Column 6). This signal is applied through an impedance matching network 132 to the bandpass filter circuit 122.

The band pass filter circuit 122 suppresses all the harmonics of the signal outside of the 2-3 MHZ range. The output of the band pass filter circuit 122 is a sine wave of the same fundamental frequency as the output from the output divider circuit 120. A 50 OHM potentiometer 134 (see FIG. 3c) terminates the output of the band pass filter 122.

The RF switch 116 is connected to the potentiometer 134 and includes a set of four diodes 136. When the diodes are forward biased by a DC voltage, the RF signal from the band pass filter circuit 122 passes relatively unhindered through the switch 116. When zero or a negative DC bias is applied to the RF switch 116, the diodes 136 inhibit the RF signal by a factor of 90 db.

The appropriate DC bias is applied to the diodes 136 through a pair of resistors 138 to the diodes. A DC return is applied through 3 inductors 140, and a capacitor 142 in the bias line prevents RF coupling between switch sections. This essentially avoids spurious signal generation by the diodes 136 during switching by maintaining a low signal level through the RF switch 116. The RF output of the switch 116 is applied through a high pass coupling capacitor 144 to the driver/amplifier circuit 112.

The conducting state of the RF switch 116 is under the control of a keying detector circuit 150 which is coupled to the switch 116 by a line 152. The keying detector circuit 150 has a pair of inputs connected to lines 154 and is effective to enable the output of the signal generator 10 (i.e., render the switch 116 into a conductive state) whenever a short circuit, an open circuit or 0 to ± 5 volts DC is applied across the lines 154.

In more detail, an optical isolator Z1 (FIG. 3c) is provided in the keying detector 150. The absence of a voltage, i.e., an open circuit, keeps the isolator Z1 turned off which applies a logic high state to an amplifier Z3. This renders the amplifier Z3 to provide a low output which in turn renders an RF switch driver transistor Q3 conductive. A pair of shaping circuits Q5, Q6 are provided coupling the amplifier Z3 to the driver transistor Q3. The output of the transistor Q3 forward biases the switch diodes 136, effectively rendering the RF switch 116 conductive and enabling the output of the signal generator 10.

As a feature of the invention, the signal generator 10 includes a fault detector circuit 160. The fault detector circuit 160 is responsive to the frequency selector signal on the line 104 and is coupled to the phase detector circuit 92 by a line 162. The fault detector circuit 160 is activated by any of three conditions:

(1) Loss of phase loop lock, as is indicated by a particular generated on the line 162; (2) failure of the oscillator 30 as would also be indicated by a signal on the line 162; and (3) frequency change of the signal generator 10 as indicated by a change in the frequency selector signal on the line 104 from the input mechanism 32.

Referring now to FIG. 3f the fault detector circuit 116 includes an input gate Z6 which detect transition bits from the switches on the mechanism 32 and the signal from the phase detector circuit 92. As long as the loop is locked, the outputs of the phase detector circuit 92 are high, having only small negative going spikes. Assuming none of the switches of the input mechanism 32 are being operated, the transition bit is also in a logic high condition, producing a logic high state upon the base of a transistor Q7. Capacitor is connected to the base of the transistor Q10 to absorb the spikes coming from the phase detector circuit 92. The high at the base of the transistor Q7 renders it into the nonconductive state, allowing a timer Z5 to output a constant low condition at its output. This low signal turns off a transistor Q4 (see FIG. 3c) which allow the RF switch driver transistor Q3 to conduct, rendering the switch diodes 136 conductive.

If the phase locked loop circuit 50 becomes out of phase (referred to as going out of lock) one or the other of the outputs from the phase detector circuit 92 will generate a negative going pulse on the line 162. This pulse is too long to be absorbed by the capacitor of the base of the transistor Q7 and renders the transistor Q7 first conductive and then nonconductive. This periodically discharges the timer Z5 by connecting it to circuit ground. The output from the timer Z5 is a logic high condition as long as the timing circuit is grounded, returning to a logic low approximately 1.5 seconds after the ground disappears. The timer Z5 is retriggerable, i.e., pulses occurring at less than 1.5 second intervals will maintain the output high. The logic high output from the timer Z5 renders the RF switch diodes 136 nonconductive through the transistors Q3 and Q4.

To prevent the output from the signal generator 10 from momentarily sweeping across undesired frequencies when switching from one frequency to another, the frequency selector signal on the line 104 includes a "transition bit" which is generated between switch positions. This bit goes to a logic low condition before any other contacts are made or broken, and returns to a high only after all other contacts are settled in the new configuration. Accordingly, a logic low condition of this bit is indicative of transition of the input mechanism 32. This transition bit is applied to the input gate Z6 and triggers the timer Z5 into a logic high output state to disable the signal generator 10 each time the carrier frequency is changed.

Although the invention has been shown and described according to a preferred embodiment, it is understood that many alterations and substitutions to the circuits herein described will be obvious to those of ordinary skill in the art without departing from the spirit and the scope of the invention.

What is claimed is:

1. A phase locked loop signal generator for exciting a radio wave transmitter to transmit over selectable frequency ranges in response to an exciter signal of a variable frequency comprising:

signal input means for generating a frequency selector signal having a value indicative of the desired frequency at which the transmitter is to transmit;

a frequency standard signal generator for providing a frequency standard signal characterized by a highly stable, unvarying frequency; and an enable signal generator responsive to the frequency standard signal and to the frequency selector signal for generating the exciter signal of a preselected frequency, the enable signal generator including a. a reference dividing circuit coupled to the frequency standard signal generator and programmable in response to said frequency selector signal for providing a reference frequency signal having a frequency which is a fractional part of that of said frequency standard signal;

b. a phase locked loop circuit responsive to the reference frequency signal and to the selector signal for producing an intermediate signal having a frequency which is a multiple of that of said reference frequency signal, said phase locked loop circuit including a programmable loop divider circuit for producing a divided down intermediate signal of a frequency which is divided down from that of said intermediate signal to a value determined by said value of the frequency selector signal; and c. output divider circuit means coupled to the phase locked loop circuit for generating the exciter signal, the frequency of the exciter signal being a fractional value of that of said intermediate signal and determined at least in part by said frequency selector signal.

2. The phase locked loop signal generator according to claim 1 wherein the phase locked loop circuit further includes;

a voltage controlled oscillator circuit for producing the intermediate signal in response to an error signal; and a phase detector and filter circuit responsive to the reference signal and to the divided down intermediate signal for producing the error signal representative of the frequency difference between said divided down intermediate signal and said reference frequency signal.

3. The phase locked loop signal generator according to claim 2, wherein the enable signal generator includes an encoder for coupling the frequency selector signal to said reference dividing circuit and to said loop divider circuit.

4. The phase locked loop signal generator according to claim 1, wherein the output divider circuit means comprises;

an output amplifier circuit for generating the exciter signal to the transmitter;

a filtered output dividing circuit responsive to the intermediate signal and to the frequency selector signal for producing a filtered intermediate signal of reduced frequency from that of said intermediate signal; and switch means selectively coupling the filtered intermediate signal to the output amplifier circuit in response to a keying signal.

5. The phase locked loop signal generator according to claim 4, and including a switch input means for generating the keying signal, thereby to operate the switch means to selectively transmit the filtered intermediate signal.

6. The phase locked loop signal generator according to claim 5, and further including a high frequency marine transmitter of the harmonic related type which transmits at a frequency determined at least in part by the frequency of the exciter signal.

7. The phase locked loop signal generator according to claim 6, wherein the transmitter is disclosed in a housing, said output amplifier is secured to said housing, said switch means is disclosed remote from said housing and a connecting cable is included coupling said switch means and said output amplifier circuit.

8. The phase locked loop signal generator according to claim 5, wherein the switch input means comprises a detector circuit coupled to the phase detector and filter circuit and to the signal input means for disabling the switch means upon the conditions that (1) the value of the frequency selector signal is altered and (2) the divided down intermediate signal differs from the referenced frequency signal by at least a predetermined value.

9. The phase locked loop signal generator according to claim 8, wherein the loop divider circuit includes:
a plurality of serially connected counting circuits of the programmable type and
control means for cyclically programming the count of the serially connected counters with different values whose magnitudes are determined according to a preprogrammed schedule of time.

10. The phase locked loop signal generator according to claim 9, wherein the phase detector and filter circuit comprises;
a phase detector circuit response to the reference signal generator and to the divided down intermediate signal for producing pulses indicative of the frequency difference therebetween, and
a filter circuit responsive to said pulses for producing the error signal to have a DC level representative of the frequency difference between said reference frequency signal and said divided down intermediate signal.

11. A phase locked loop signal generator for exciting a radio wave transmitter to transmit over selectable frequency ranges in response to an exciter signal of a variable frequency comprising:
signal input means for generating a frequency selector signal indicative of the desired frequency at which the transmitter is to transmit;
a frequency standard signal generator for providing a frequency standard signal characterized by a highly stable, unvarying frequency; and
an enable signal generator responsive to the frequency standard signal and to the frequency selector signal for generating the exciter signal of a preselected frequency, the enable signal generator including
a. a reference dividing circuit coupled to the frequency standard signal generator and programmable in response to said frequency selector signal for providing a reference frequency signal having a frequency which is a fractional part of that of said frequency standard signal;
b. a phase locked loop circuit responsive to the reference frequency signal for producing an intermediate signal having a frequency which is a multiple of that of said reference frequency signal; and
c. output divider circuit means coupled to the phase locked loop circuit for generating the exciter signal responsive to said frequency selector signal, the frequency of the exciter signal being a fractional value of that of said intermediate signal and determined at least in part by said frequency selector signal, said output divider circuit means including:
an output amplifier circuit for generating the exciter signal to the transmitter;
a filtered output dividing circuit responsive to the intermediate signal and to the frequency selector signal for producing a filtered intermediate signal of reduced frequency from that of said intermediate signal; and
switch means selectively coupling the filtered intermediate signal to the output amplifier circuit in response to a keying signal.

12. A phase locked loop signal generator for exciting a harmonic related radio wave transmitter to transmit over selectable frequency ranges in response to an exciter signal of a variable frequency, the transmitter having a variable multiplier circuit for multiplying the exciter signal by varying values determined by the frequency range selected, the generator comprising:
signal input means for generating a frequency selector signal having a value indicative of the desired frequency at which the transmitter is to transmit;
a frequency standard signal generator for providing a frequency standard signal characterized by a highly stable, unvarying frequency; and
an enable signal generator responsive to the frequency standard signal and to the frequency selector signal for generating the exciter signal at a preselected frequency, the enable signal generator including
a. a reference dividing circuit coupled to the frequency standard signal generator and programmable in response to said frequency selector signal for dividing said frequency standard signal by a variable factor determined according to said selected frequency range, to thereby provide a reference frequency signal having a frequency which is a fractional part of that of said frequency standard signal;
b. a phase locked loop circuit responsive to the reference frequency signal for producing an intermediate signal having a frequency which is increased over that of said reference frequency signal and which is of a value controlled by said selector signal according to said selected frequency range, said phase locked loop circuit including a programmable loop divider circuit for producing a divided down intermediate signal of a frequency which is divided down from that of said intermediate signal to a value determined by said value of the frequency selector signal; and
c. output divider circuit means coupled to the phase locked loop circuit for dividing the frequency of said intermediate signal to thereby generate the exciter signal, the output divider circuit means being programmed to divide said intermediate signal by a factor determined by said frequency selector signal and according to said selected frequency range.

* * * * *

UNITED STATES PATENT OFFICE
CERTIFICATE OF CORRECTION

Patent No. 4,107,612    Dated August 15, 1978

Inventor(s) J. Howard Leveque

It is certified that error appears in the above-identified patent and that said Letters Patent are hereby corrected as shown below:

Table II, Column 6, Line 1, "2.0001" should read

Signed and Sealed this

*Tenth* Day of *April 1979*

[SEAL]

Attest:

RUTH C. MASON
*Attesting Officer*

DONALD W. BANNER
*Commissioner of Patents and Trademarks*

UNITED STATES PATENT OFFICE
CERTIFICATE OF CORRECTION

Patent No. 4,107,612　　　　　　Dated August 15, 1978

Inventor(s)　J. Howard Leveque

It is certified that error appears in the above-identified patent and that said Letters Patent are hereby corrected as shown below:

Table II, Column 6, Line 1, "2.0001" should read --2.0901--

This certificate supersedes Certificate of Correction issued April 10, 1979.

Signed and Sealed this

*Seventeenth* Day of *July 1979*

[SEAL]

*Attest:*

LUTRELLE F. PARKER

*Attesting Officer*　　*Acting Commissioner of Patents and Trademarks*